(12) United States Patent
Shimoishizaka et al.

(10) Patent No.: US 7,847,198 B2
(45) Date of Patent: Dec. 7, 2010

(54) WIRING BOARD AND METHOD FOR MANUFACTURING THE SAME, AND SEMICONDUCTOR DEVICE

(75) Inventors: Nozomi Shimoishizaka, Kyoto (JP); Yoshifumi Nakamura, Osaka (JP)

(73) Assignee: Panasonic Corporation, Osaka (JP)

( * ) Notice: Subject to any disclaimer, the term of this patent is extended or adjusted under 35 U.S.C. 154(b) by 769 days.

(21) Appl. No.: 11/742,159

(22) Filed: Apr. 30, 2007

(65) Prior Publication Data

US 2007/0284738 A1      Dec. 13, 2007

(30) Foreign Application Priority Data

May 23, 2006    (JP)    .............. 2006-143172

(51) Int. Cl.
*H05K 1/11*      (2006.01)
*H01R 12/04*     (2006.01)
(52) U.S. Cl. ...................... 174/267; 174/260
(58) Field of Classification Search ........... 174/259, 174/260, 267
See application file for complete search history.

(56) References Cited

U.S. PATENT DOCUMENTS

| | | | |
|---|---|---|---|
| 5,296,649 A * | 3/1994 | Kosuga et al. | 174/250 |
| 6,734,566 B2 * | 5/2004 | Honda | 257/778 |
| 6,914,200 B2 * | 7/2005 | Higuchi et al. | 174/267 |
| 7,304,249 B2 * | 12/2007 | Lee et al. | 174/267 |
| 2004/0212969 A1 | 10/2004 | Imamura et al. | |

FOREIGN PATENT DOCUMENTS

JP      2003-243455      8/2003

* cited by examiner

*Primary Examiner*—Ishwarbhai B Patel
(74) *Attorney, Agent, or Firm*—Hamre, Schumann, Mueller & Larson, P.C.

(57) ABSTRACT

A wiring board includes an insulating base; an adhesive layer formed on the surface of the insulating base; a conductor wiring formed on the surface of the adhesive layer; and a bump formed crossing the longitudinal direction of the conductor wiring over regions on the adhesive layer on both sides of the conductor wiring, wherein the back face at a part of the conductor wiring where the bump is formed, and the back faces and parts of the side faces of the bump formed above the regions of the adhesive layer on both sides of the conductor wiring, are embedded in the surface of the adhesive layer so as to be adhered to the adhesive layer. Even when the wiring width of the conductor wiring is decreased, the conductor wiring can be adhered to the wiring board firmly.

13 Claims, 10 Drawing Sheets

WIRING BOARD AND METHOD FOR MANUFACTURING THE SAME, AND SEMICONDUCTOR DEVICE

BACKGROUND OF THE INVENTION

1. Field of the Invention

The present invention relates to a wiring board on which bumps are formed and a method for manufacturing the same, and also relates to a semiconductor device using the wiring board.

2. Description of Related Art

A conventionally known semiconductor device has a semiconductor element that is face-down mounted on a wiring board provided with bumps and electrode pads on the semiconductor element are bonded to the bumps on the wiring board using a TAB (Tape Automated Bonding) method commonly used for the manufacture of semiconductor devices for liquid crystal displays etc. (see US 2004/0212969 A1, for example).

Hereinafter, a conventional wiring board provided with bumps, and a semiconductor device using such a wiring board will be described with reference to the drawings. FIG. 8 is a plan view showing a conventional wiring board 21, and FIG. 9 is a sectional view taken along the line B-B' in FIG. 8.

In FIGS. 8 and 9, reference numeral 22 denotes an insulating base, and reference numeral 23 denotes conductor wirings formed on a surface of the insulating base 22. A bump 24 is formed on a leading end portion of each conductor wiring 23. Numeral 25 denotes first conductive layers for coating the surfaces of the conductor wirings 23 and the bumps 24, which are formed by electrolytic Au plating, electrolytic Ni/Au plating, or electroless Sn plating or the like.

In the wiring board to be used for packaging according to the TAB method, the insulating base etc. is formed of a flexible material or formed so as to have flexibility, and the steps of supplying the wiring board, mounting the semiconductor element on the wiring board, carrying out inspection after the semiconductor element has been mounted, etc. are performed continuously by a reel-to-reel method. In order to impart flexibility to the wiring board, a flexible tape formed of polyimide or the like and having a thickness of about 12 μm to about 40 μm is used as the insulating base 22. The conductor wirings 23 on the insulating base 22 are formed by patterning a Cu foil having a thickness of about 9 μm to about 18 μm by wet etching. In a case of forming the conductor wirings 23 through wet etching, since the etching proceeds from the upper faces of the conductor wirings downwards and in the transverse direction, the cross-section of each conductor wiring 23 is tapered as shown in FIG. 9. For example, in a case where the pitch of the conductor wirings is 40 μm, when a Cu foil of 9 μm in thickness is used and subjected to wet etching so that the bottom width of the conductor wiring 23 becomes 15 μm, the width of the upper face part of the conductor wiring 23 will be about 8 μm. Each bump 24 is formed by electrolytic copper plating so as to have a thickness of about 8 μm and a width of about 20 μm, crossing the longitudinal direction of each conductor wiring 23 over both side regions of the conductor wiring 23.

FIG. 10 is a sectional view showing a semiconductor device obtained by face-down mounting a semiconductor element 26 on the conventional wiring board 21, with application of heat and pressure. Electrode pads 27 are formed on the semiconductor element 26, and second conductive layers 28 are formed to coat the surfaces of the electrode pads 27. The second conductive layers 28 are bonded to the bumps 24 on the wiring board 21 via the first conductive layers 25. The second conductive layers 28 are formed by electrolytic Au plating, electroless Ni/Au plating or the like.

Recently, due to the tendency for larger and higher resolution liquid crystal display panels, the number of pins has increased in a semiconductor device used for a liquid crystal display assembled using the TAB method. In some usages, a semiconductor chip of about 20 mm×1 mm having more than 1000 electrode pads has appeared. As a result, the pitch for the electrode pads has been decreased, and a pitch of not more than 40 μm is required.

However, in a semiconductor device using the conventional wiring board 21 as shown in FIG. 10, only the bottom faces of the conductor wirings 23 adhere to the surface of the insulating base 22. The bottom faces of the bumps 25 grow in contact with the surface of the insulating base 22 due to the electroplating, but it does not adhere. Therefore, when the wiring width of the conductor wirings 23 is decreased correspondingly to the narrowing pitch of the electrode pads 27, the adhesion strength between the conductor wirings 23 and the insulating base 22 will be decreased. This will cause a problem that the conductor wirings 23 are peeled from the insulating base 22 due to a thermal stress after the face-down mounting of the semiconductor element 26 or a mechanical stress caused by bending or the like of the wiring board 21 during a reel-to-reel conveyance that is characteristic to the TAB method.

SUMMARY OF THE INVENTION

The present invention has been made in order to solve the above-described problems in the prior art, and it is an object of the present invention to provide a wiring board in which conductor wirings are adhered firmly to the wiring board even when the conductor wiring has a reduced width.

For achieving the above object, a wiring board having a first configuration according to the present invention includes: an insulating base; an adhesive layer formed on the surface of the insulating base; a conductor wiring formed on the surface of the adhesive layer; and a bump formed crossing the longitudinal direction of the conductor wiring over regions on the adhesive layer on both sides of the conductor wiring, wherein the back face at a part of the conductor wiring where the bump is formed, and the back faces and parts of the side faces of the bump formed above the adhesive layer on both sides of the conductor wiring, are embedded in the surface of the adhesive layer so as to be adhered to the adhesive layer.

A wiring board having a second configuration according to the present invention includes: an insulating base having at least an adhesive surface; a conductor wiring formed on the surface of the insulating base; and a bump formed crossing the longitudinal direction of the conductor wiring over regions on the insulating base on both sides of the conductor wiring, wherein the back face at a part of the conductor wiring where the bump is formed, and the back faces and parts of the side faces of the bump formed above the insulating base on both sides of the conductor wiring, are embedded in the surface of the insulating base so as to be adhered to the insulating base.

A method for manufacturing a wiring board according to the present invention includes the steps of: preparing a lamination base comprising an insulating base, an adhesive layer formed on the insulation base, and a conductor layer laminated on the adhesive layer; patterning the conductor layer on the surface of the lamination base so as to form a conductor wiring; forming a bump by electroplating using the conductor wiring as a cathode, where the bump crosses the longitudinal direction of the conductor wiring over regions on the adhesive layer on both sides of the conductor wiring; and subjecting the bump to heat and pressure from above so that the back face at a part of the conductor wiring under the bump, and the back faces and parts of the side faces of the bump in the regions formed above the adhesive layer on both sides of the conductive wiring, are buried inwards from the surface of the adhesive layer so as to be adhered to the adhesive layer.

A method for manufacturing a semiconductor device according to the present invention includes the steps of: preparing a lamination base comprising an insulating base, an adhesive layer formed on the insulation base, and a conductor layer laminated on the adhesive layer; patterning the conductor layer on the surface of the lamination base so as to form a conductor wiring; forming a bump by electroplating using the conductor wiring as a cathode, where the bump crosses the longitudinal direction of the conductor wiring over regions on the adhesive layer on both sides of the conductor wiring; coating the surface of the bump and parts of side faces of the bump formed above the adhesive layer on both sides of the conductor wiring, with a conductive layer formed of a material different from the material of the bump; preparing a semiconductor chip having an electrode pad at a position corresponding to the bump, and placing the electrode pad on the semiconductor chip and the bump to correspond to each other, applying heat and pressure through the back face of the semiconductor chip so as to press and bond the electrode pad to the conductive layer on the surface of the bump with heat, and at the same time causing the back faces and parts of the side faces of the bump formed above the regions of the adhesive layer on both sides of the conductor wiring to be buried inwards from the surface of the adhesive layer so as to be adhered to the adhesive layer via the conductive layer.

DETAILED DESCRIPTION OF THE INVENTION

Figure 1:
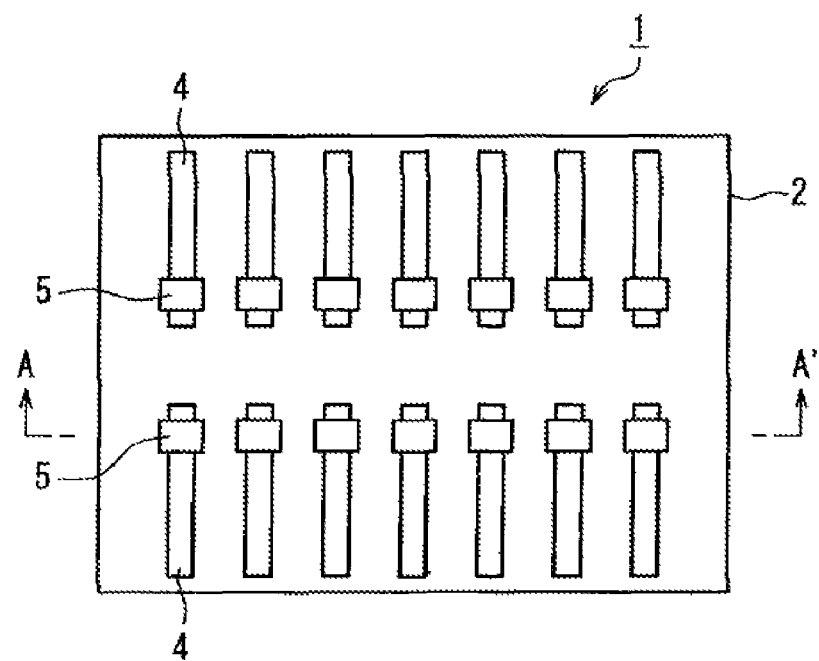
FIG. 1 is a plan view showing a wiring board according to first and second embodiments of the present invention.

In a wiring board according to the present invention, a bump formed crossing the longitudinal direction of a conductor wiring over regions on an adhesive layer on both sides of the conductor wiring or over a region of an adhesive insulating base is embedded in the surface of either the adhesive layer or the insulating base, and not only the back face of the conductor wiring but the back faces and parts of the side faces of the bump are adhered to either the adhesive layer or the insulating base. Thereby, even when the wiring width of the conductor wiring is decreased, the bump is adhered to the wiring board firmly.

According to a method for manufacturing a wiring board or a method for manufacturing the semiconductor device according to the present invention, since a bump is formed by electroplating using a conductor wiring as a cathode, the bump is made wider than the back face of the conductor wiring, and the side faces of the bump are connected to the back face of the conductor wiring via the back faces of the bump so as to have a smooth convex shape. Thereby, the adhesion area between the bump and the adhesive layer can be increased to adhere to the wiring board firmly.

In the wiring board having the first configuration according to the present invention, it is preferable that the bump formed crossing the longitudinal direction of the conductor wiring over the regions on the adhesive layer on both sides of the conductor wiring is wider than the back face of the conductor wiring, and a surface of an area ranging from the back face of the conductor wiring to the side faces of the bump via the back faces of the bump has a smooth convex shape.

Further, it is preferable that the adhesive layer formed on the surface of the insulating base has a thickness greater than the distance that the back face at a part of the conductor wiring where the bump is formed and the back faces and parts of the side faces of the bump formed above the adhesive layer on both sides of the conductor wiring are embedded in the surface of the adhesive layer.

Further, it is preferable that the surface of the bump and the regions of the bump formed on the adhesive layer on both sides of the conductor wiring are coated with a first conductive layer formed of at least one material different from the material of the bump.

Further, it is preferable that the side faces of the bump on the regions embedded in the surface of the adhesive layer are adhered to the adhesive layer via the first conductive layer.

In the wiring board having the second configuration according to the present invention, it is preferable that the bump formed crossing the longitudinal direction of the conductor wiring over the regions of the insulating base on both sides of the conductor wiring is wider than the back face of the conductor wiring, and a surface of an area ranging from the back face of the conductor wiring to the side faces of the bump via the back faces of the bump has a smooth convex shape.

Further, it is preferable that the surface of the bump and the regions of the bump on the insulating base on both sides of the conductor wiring are coated with a first conductive layer formed of at least one material different from the material of the bump.

Further, it is preferable that the side faces of the bump on the regions embedded in the surface of the insulating base are adhered to the insulating base via the first conductive layer.

A semiconductor device according to the present invention includes a wiring board having any of the above-mentioned configurations and a semiconductor chip mounted on the wiring board, where an electrode pad on the semiconductor chip and the bump formed on the wiring board are connected electrically to each other.

In this configuration, it is preferable that a second conductive layer made of at least one material different from the material of the electrode pad is formed on the surface of the electrode pad.

In the method for manufacturing a wiring board having a configuration of the present invention, it is preferable that the method further includes, subsequent to the step of forming the bump by electroplating using the conductor wiring as a cathode, where the bump crosses the longitudinal direction of the conductor wiring over regions on the adhesive layer on both sides of the conductor wiring, a step of coating the surface of the bump and the parts of the side faces of the bump formed above the adhesive layer on both sides of the conductor wiring, with a conductive layer formed of at least one material different from the material of the bump, wherein the bump coated with the conductive layer is subjected to heat and pressure from above so that the back faces and the parts of the side faces of the bump formed above the adhesive layer on both sides of the conductor wiring are buried inwards from the surface of the adhesive layer so as to be adhered to the adhesive layer via the conductive layer.

In the method for manufacturing the semiconductor device according to the present invention, it is preferable that an ultrasonic vibration is applied at the same time as the step of applying heat and pressure through the back face of the semiconductor chip.

Embodiments of the present invention will be described below with reference to the attached drawings.

First Embodiment

Figure 2A:
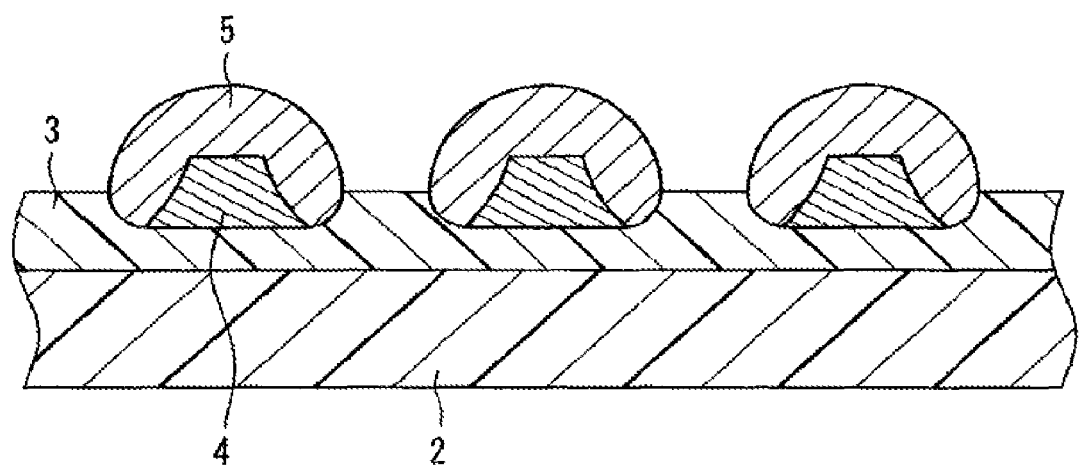
FIG. 2A is a sectional view showing the cross section of the wiring board taken along the line A-A' in FIG. 1.

FIG. 1 is a plan view showing a wiring board 1 according to first and second embodiments of the present invention, and FIG. 2A is a sectional view showing the cross section taken along the line A-A' in FIG. 1.

In FIGS. 1 and 2A, numeral 2 denotes an insulating base, 3 denotes an adhesive layer formed on the surface of the insulating base 2, and 4 denotes conductor wirings formed on the adhesive layer 3. A bump 5 is formed crossing the leading tip portion of each conductor wiring 4 over regions on the adhesive layer 3 on both sides of the conductor wiring 4. As shown in FIG. 2A, the back face at a part of the conductor wiring 4 where the bump 5 is formed, and the back faces and parts of the side faces of the bump 5 formed above the adhesive layer 3 on both sides of the conductor wiring 4, are embedded in the surface of the adhesive layer 3 so as to be adhered to the adhesive layer 3.

Here, a flexible tape made of polyimide or the like having a thickness of about 12 μm to about 40 μm may be used for the insulating base 2. The adhesive layer 3 on the insulating base 2 may be made of epoxy or the like, and the thickness is about 3 μm to about 10 μm. The conductor wirings 4 may be formed by patterning a Cu foil having a thickness of about 9 μm to about 18 μm through wet etching. When the conductor wirings 4 are formed by the wet etching, since the etching proceeds from the upper part of each conductor wiring 4 downwards and in the transverse direction, the cross section of the conductor wiring 4 will be tapered as shown in FIG. 2A. The bumps 5 may be formed by electrolytic Cu plating. The widths and heights of the conductor wiring 4 and each bump 5 are determined in view of the insulation, the machining accuracy, and the mechanical strength. For example, when the pitch of the conductive wiring 4 is 40 μm, a Cu foil 9 having a thickness of 9 μm is subjected to wet etching so that the width of the lower part of the conductor wiring 4 will be 15 μm. In this case, the width of the upper part of the conductor wiring 4 will be about 8 μm. The bump 5 having a thickness of about 8 μm and a width of about 20 μm is formed on the conductor wiring 4 by electroplating.

It is preferable that the thickness of the adhesive layer 3 is greater than the depth by which the back face at a part of the conductor wiring 4 where the bump 5 is formed and the back faces and parts of the side faces of the bump 5 formed above the adhesive layer 3 on both sides of the conductor wiring 4 are embedded in the surface of the adhesive layer 3.

The Cu used as the material for the bump 5 can be replaced with another conductive material such as Au, Ni and In.

Figure 2B:
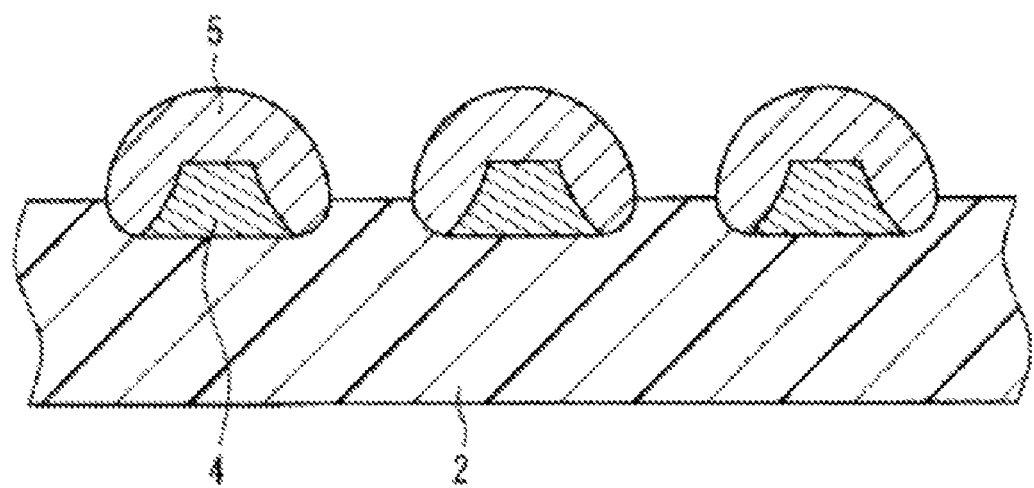
FIG. 2B is a sectional view showing the cross section of another embodiment of the wiring board.

Instead of the configuration that the adhesive layer 3 is formed on the surface of the insulating base 2, a configuration that at least the surface of the insulating base 2 shows adhesiveness can be used as shown in FIG. 2B. The same can be applied to any of the following embodiments.

As mentioned above, according to the first embodiment of the present invention, the back face at a part of the conductor wiring 4 where the bump 5 is formed, and the back faces and parts of the side faces of the bump 5 formed above the adhesive layer 3 on both sides of the conductor wiring 4, are embedded in the surface of the adhesive layer 3 so as to be adhered to the adhesive layer 3. Therefore, the adhesion strength between the conductor wiring 4 and the adhesive layer 3 can be improved in comparison with a case where only the back face of the conductor wiring 4 adheres to the adhesive layer 3.

Second Embodiment

The wiring board according to a second embodiment of the present invention has the configuration as shown in the above-mentioned sectional view of FIG. 2A.

In the cross section of FIG. 2A, the bump 5 formed crossing the longitudinal direction of the conductor wiring 4 over regions on the adhesive layer 3 on both sides of the conductor wiring 4 is wider than the back face of the conductor wiring 4. And a surface of an area ranging from the back face of the conductor wiring 4 to the side faces of the bump 5 via the back faces of the bump 5 has a smooth convex shape. The back faces and parts of the side faces of the bump 5 are embedded in the surface of the adhesive layer 3 to be adhered to the adhesive layer 3.

According to the second embodiment, since the back faces and the side faces of the bump 5 can be adhered tightly to the adhesive layer 3 continuously without any substantial gap being formed between the side faces of the bump 5 and the adhesive layer 3, the adhesion strength between the bump 5 and the adhesive layer 3 can be improved.

Third Embodiment

Figure 3:
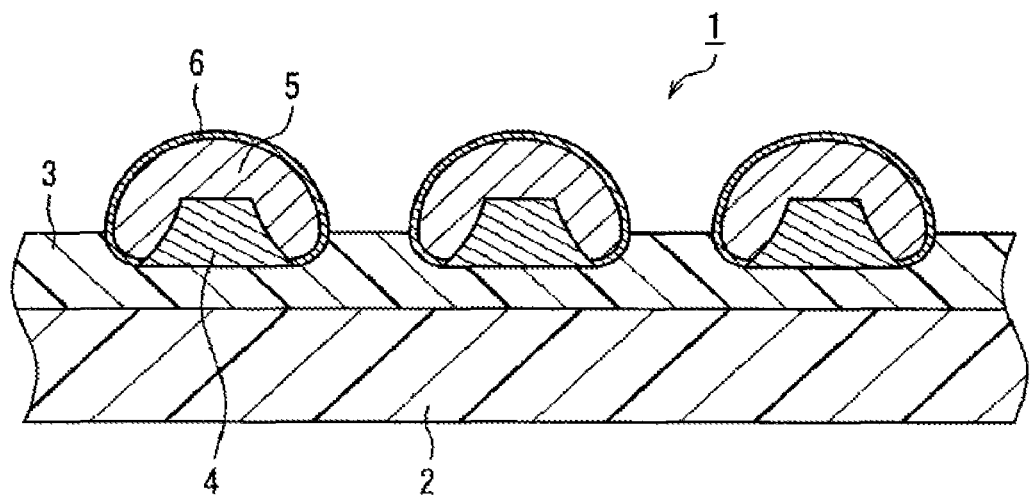
FIG. 3 is a sectional view showing a wiring board according to a third embodiment of the present invention.

FIG. 3 is a sectional view showing a wiring board 1 according to a third embodiment of the present invention. In FIG. 3, the insulating base 2, the adhesive layer 3, the conductor wirings 4 and the bumps 5 are similar to those of the first embodiment. Furthermore, first conductive layers 6 for coating the bumps 5 are provided, through which the back faces and the side faces of the bumps 5 are adhered to the adhesive layer 3.

Here, for example, each first conductive layer 6 of Au having a thickness of about 0.3 μm to about 2 μm may be formed by electroplating. In view of the barrier property and the material of the first conductive layer 6, the thickness of the Au will be set to about 0.5 μm. Alternatively, the first conductive layer 6 can be made of plural materials. For example, the ground layer can be made of Ni having a thickness of about 1 μm and the surface layer can be made of Au having a thickness of about 0.5 μm. Alternatively, the first conductive layer 6 can be formed not by the electroplating but by electroless plating.

According to the third embodiment, the back faces and the side faces of each bump 5 adhere to the adhesive layer 3 via the first conductive layer 6. As a result, the first conductive layer 6 serves as a barrier to prevent diffusion of the material of the bump 5 in the adhesive layer 3, thereby improving the insulation reliability of the wiring board 1.

Fourth Embodiment

Figure 4:
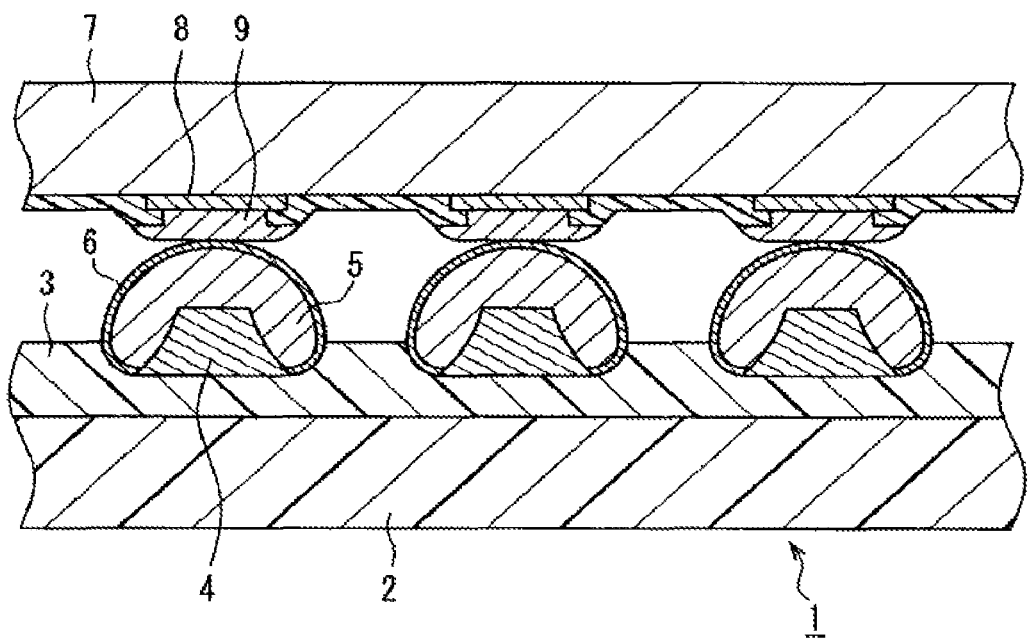
FIG. 4 is a sectional view showing a semiconductor device according to a fourth embodiment of the present invention.

FIG. 4 is a sectional view showing a semiconductor device according to a fourth embodiment of the present invention. The wiring board 1 in FIG. 4 is similar to that of the third embodiment, and it is formed of the insulating base 2, the adhesive layer 3, the conductor wirings 4, the bumps 5 and the first conductive layers 6. Numeral 7 denotes a semiconductor element face-down mounted on the wiring board 1. Electrode pads 8 are formed on the semiconductor element 7, and a second conductive layer 9 is formed to coat the surface of each electrode pad 8. The second conductive layers 9 are bonded to the bumps 5 via the first conductive layers 6.

The second conductive layers 9 may be formed by electrolytic Au plating, electroless Ni/Au plating or the like, for example. In one example, an electroless Ni plating having a thickness of 4 μm is formed, on which an electroless Au plating having a thickness of about 0.1 μm is formed further.

According to the fourth embodiment, the back face of each conductor wiring 4 in the region where the bump 5 is formed, and also the back faces and parts of the side faces of the bump 5 formed above the adhesive layer 3 on both sides of the conductor wiring 4, are embedded in the surface of the adhesive layer 3 so as to be adhered to the adhesive layer 3. Therefore, in comparison with a case where only the back face of the conductor wiring 4 adheres to the adhesive layer 3, the adhesion strength between the conductor wiring 4 and the adhesive layer 3 is improved. Thereby, peeling of the conductor wirings 4 and the bumps 5 from the wiring board 1, which is caused by a thermal stress due to the face-down mounting of the semiconductor element 7 or a mechanical stress due to bending or the like of the wiring board 1 during a reel-to-reel conveyance being characteristic to the TAB method, can be suppressed.

Fifth Embodiment

A method for manufacturing a wiring board according to a fifth embodiment of the present invention will be described with reference to the drawings. FIGS. 5A-5G illustrate the process of manufacturing the wiring board 1 as shown in FIGS. 1-3 in this order. FIG. 6 is a plan view illustrating the process between FIGS. 5B and 5C. The components corresponding to those of the wiring board 1 as shown in FIGS. 1-3 are assigned with the same reference numbers and repeated explanation will be omitted.

Figure 5A:
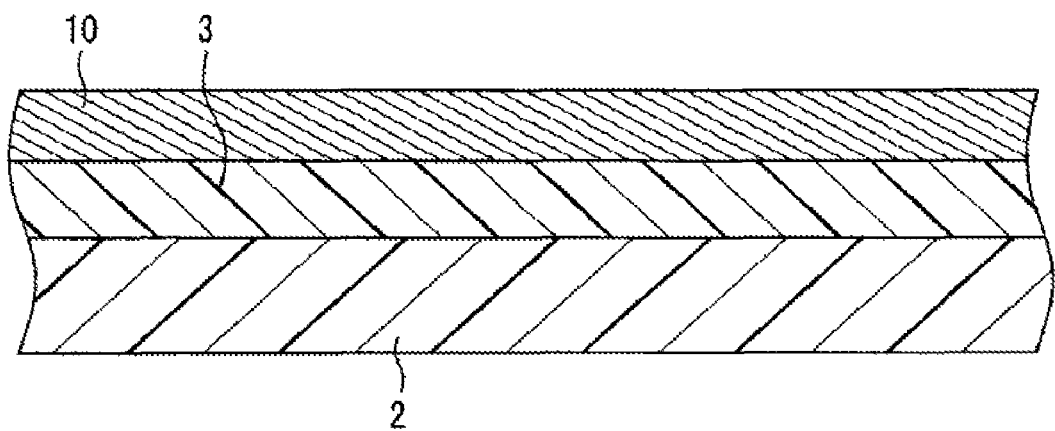
FIG. 5A to 5G are sectional views illustrating a method of manufacturing a wiring board according to a fifth embodiment of the present invention.
Figure 5B:
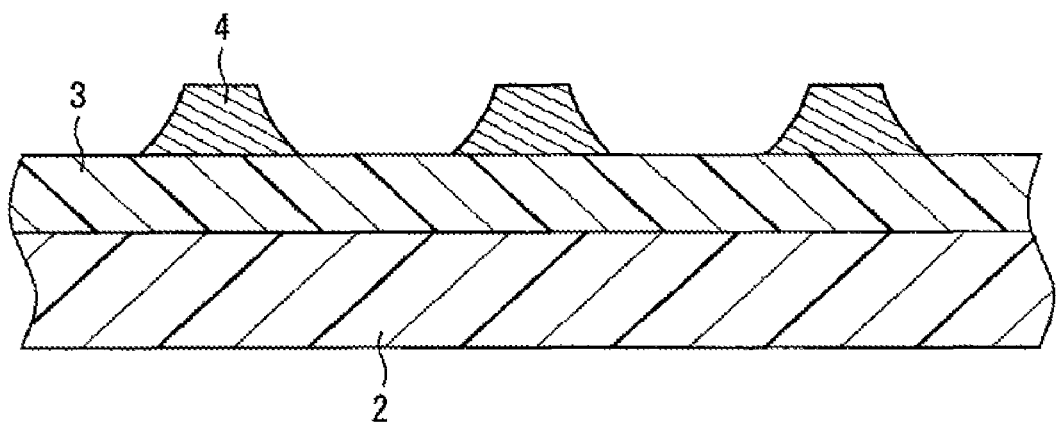

FIG. 5A is a sectional view taken along the line A-A' in FIG. 1, during the process of manufacturing the wiring board 1, in which a Cu foil 10 adhered to the adhesive layer 3 is shown. In the plan view of FIG. 6, 11 denotes a resist formed on the entire surface of the wiring board 1, and 12 denotes openings in the resist 11. Each opening 12 is formed extending over plural conductor wirings 4. FIGS. 5B-5F are sectional views showing the same position as in FIG. 5A. FIG. 5G also is a sectional view showing the same position of the wiring board during the manufacturing process, and it shows also a heating tool 13 and a stage 14.

First, as shown in FIG. 5A, a lamination base is prepared by adhering the insulating base 2 and the Cu foil 10 via the adhesive layer 3. Next, as shown in FIG. 5B, the Cu foil 10 is subjected to wet etching to form conductor wirings 4. At this time, since the etching proceeds from the upper parts of the conductor wirings 4 downward and in the transverse direction, each of the conductor wirings 4 will have a tapered cross section as shown in these drawings.

Next, as shown in FIG. 6, the resist 11 is formed on the entire surface of the wiring board 1 on which the conductor wirings 4 have been formed, and the resist 11 is patterned to form openings 12, each bridging over plural conductor wirings 4. By performing an electrolytic Cu plating using the conductor wirings 4 as a cathode, the Cu plating is deposited on the conductor wirings 4 exposed through the openings 12, and thereby the bumps 5 as shown in FIG. 5E are formed.

Figure 5C:
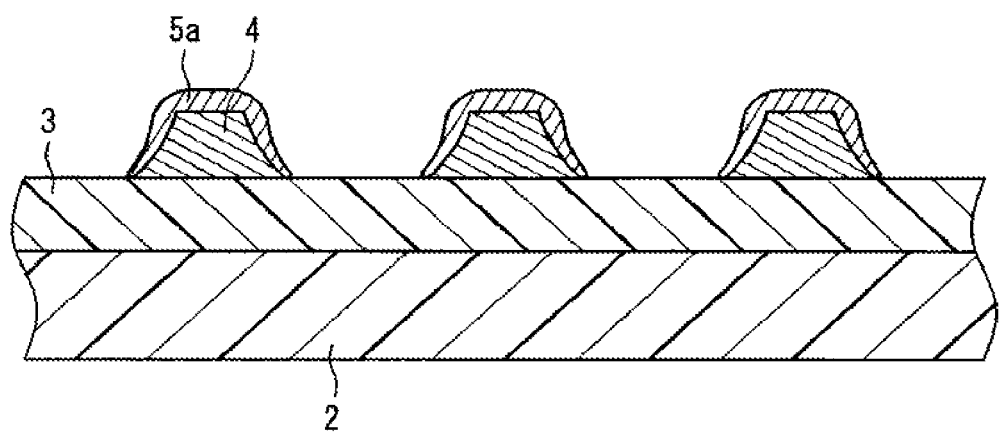
Figure 5D:
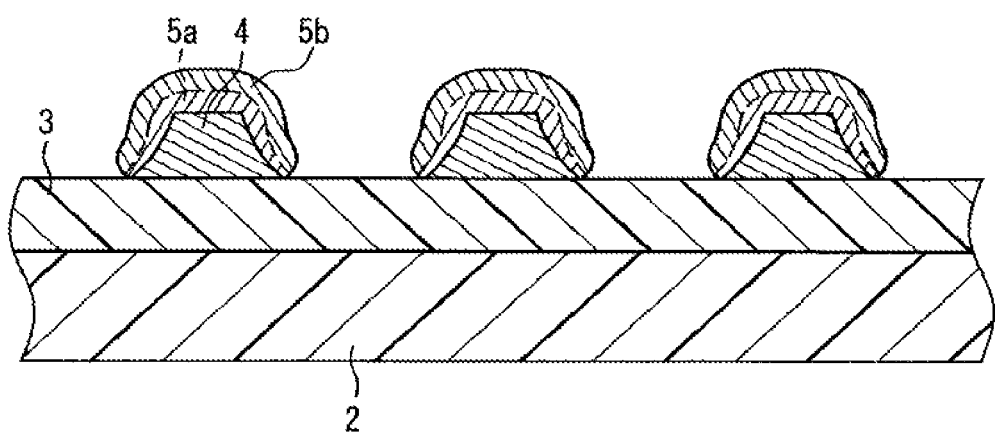
Figure 5E:
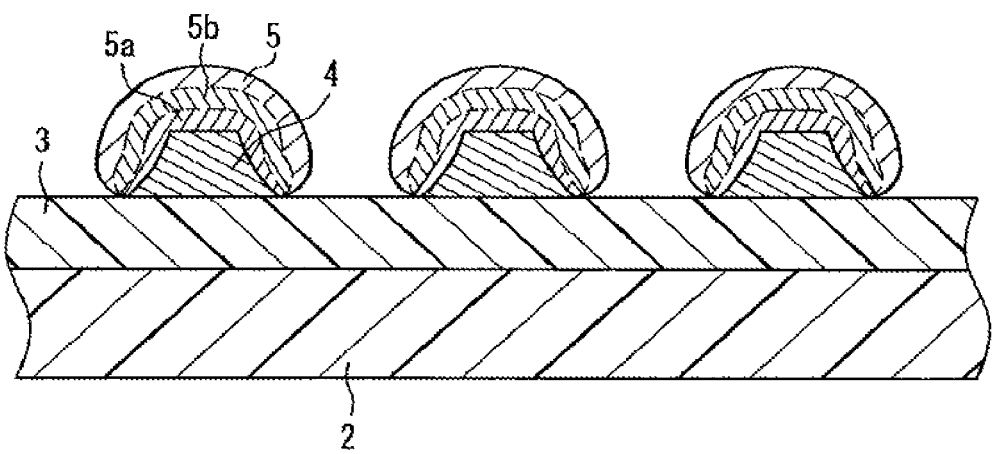
Figure 6:
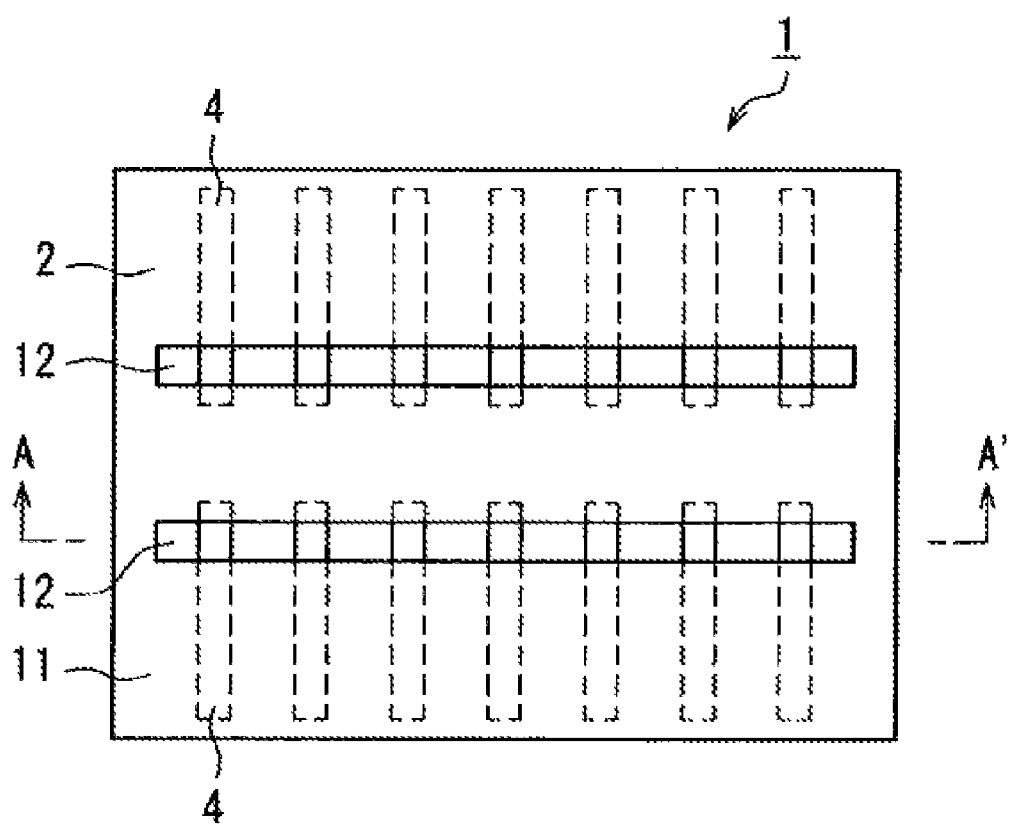
FIG. 6 is a plan view illustrating the manufacturing method shown in FIGS. 5A to 5G.

FIG. 5C-5E show the process of electrolytic Cu plating using the conductor wirings 4 as the cathode, where deposition of the plating around the conductor wirings 4 are shown in a chronological order, and the shapes of the bumps in the respective drawings are denoted as 5a, 5b and 5.

In the electrolytic Cu plating process, Cu ions in the plating solution are coupled with electrons supplied from the conductor wirings 4 as the cathode, and thus the plating is deposited on the surfaces of the conductor wirings 4. Since the Cu ions are consumed at the upper parts of the conductor wirings 4 at this time, the Cu ion concentration in the plating solution is reduced at the lower parts of the conductor wirings 4. As a result, the plating deposited on the upper parts of each conductor wiring 4 is thick while the plating deposited on the lower part of the conductor wiring 4 is thin. Therefore, even when the cross section of the conductor wiring 4 is tapered, as shown in FIGS. 5C-5E, the bump deposited around the conductor wiring 4 will have a shape such that a surface of an area ranging from the back face of the conductor wiring 4 to the side faces of the bump 5 via the back faces of the bump 5 has a smooth convex shape.

Figure 5F:
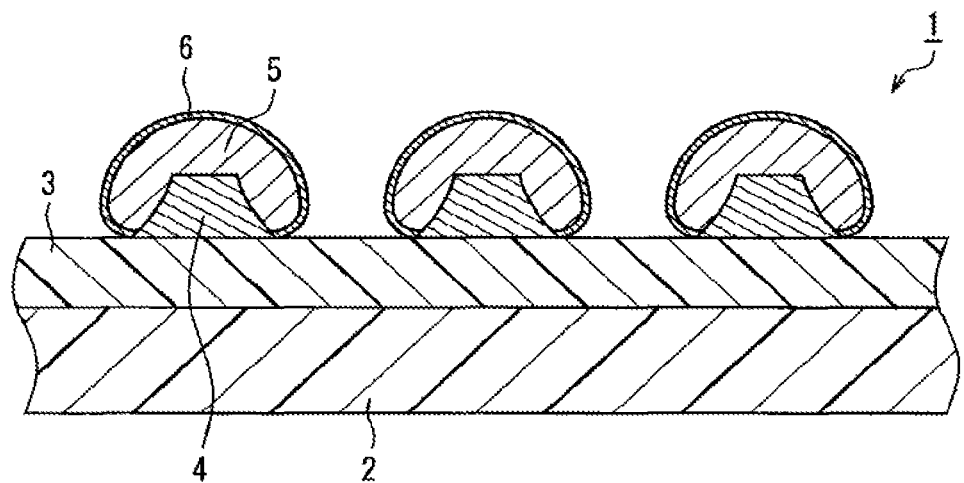
Figure 5G:
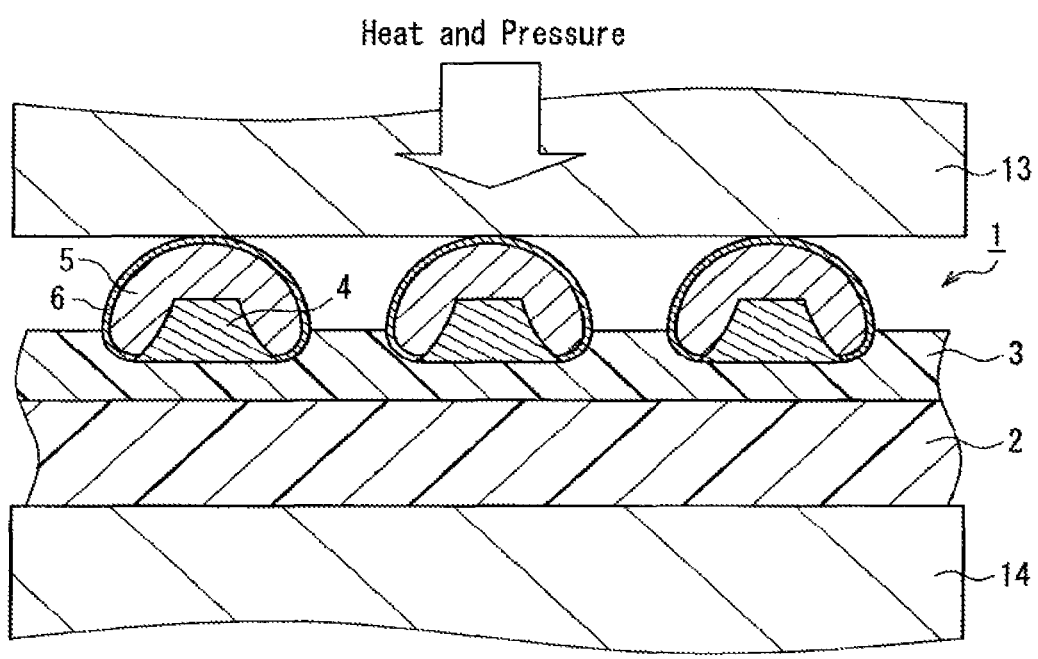

Next, as shown in FIG. 5F, the surface of each bump 5 is coated with a metal different from the material of the bump 5, thereby forming the first conductive layer 6.

Next, as shown in FIG. 5G, the wiring board 1 is placed on the stage 14, and the surfaces of the bumps 5 are subjected to heat and pressure from above by the heating tool 13, so that the back face of each conductor wiring 4 and the back faces and parts of the side faces of each bump 5 are buried inwards from the surface of the adhesive layer 3. Thereby, the adhesive layer 3 is melted and adhered to the bumps 5 via the first conductive layer 6. When the adhesive layer 3 is based on epoxy, the temperature of the heating tool 13 is set to 200° C. to 300° C. If the stage 14 also is heated at this time, the adhesive layer 3 can be melted and adhered in a short time.

According to the fifth embodiment, since the bumps 5 are formed around the conductor wirings 4 by electroplating using the conductor wirings 4 as the cathode, even when the cross section of each conductor wiring 4 is tapered, the bump 5 to be deposited around the conductor wiring 4 will have a shape that a surface of an area ranging from the back face of the conductor wiring 4 to the side faces of the bump 5 via the back faces of the bump 5 has a smooth convex shape. Therefore, when the back faces and parts of the side faces of the bump 5 are buried inwards from the surface of the adhesive layer 3 so as to be adhered to the adhesive layer 3, the back faces and the side faces of the bump 5 will be adhered to the adhesive layer 3 continuously without having a gap between the side faces of the bump 5 and the adhesive layer 3, and thus the adhesion strength between the bump 5 and the adhesive layer 3 can be improved.

Moreover, since after formation of the first conductive layers 6 on the surfaces of the bumps 5, the surfaces of the bumps 5 are applied with heat and pressure from above so that the back faces and parts of the side faces of the bumps 5 are buried inwards from the surface of the adhesive layer 4 and adhered to the adhesive layer 3 via the first conductive layers 6refore, the first conductive layers 6 serve as a barrier, so that diffusion of the material of the bumps 5 into the adhesive layer 3 is prevented, thereby improving the insulation reliability of the wiring board 1.

Sixth Embodiment

A method for manufacturing a semiconductor device according to a sixth embodiment of the present invention will be described with reference to the drawings.

Figure 7A:
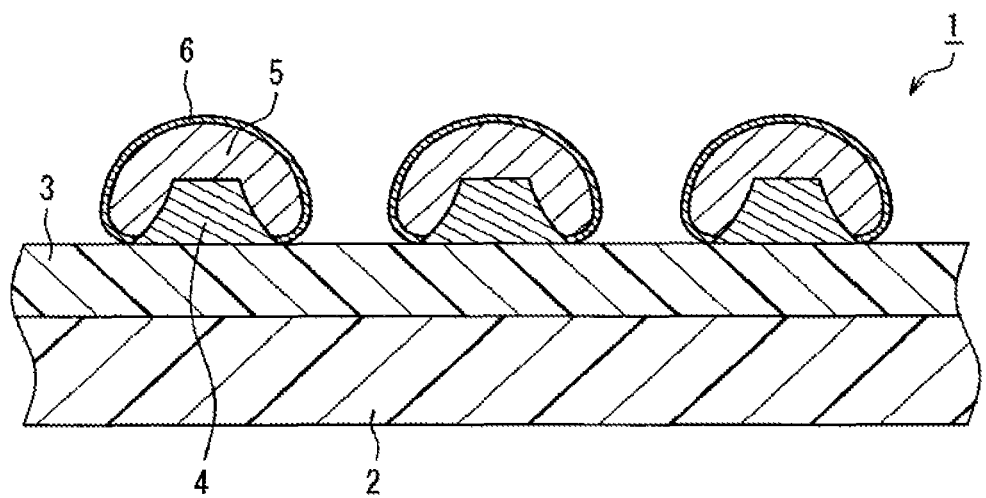
FIG. 7A and 7B are sectional views illustrating a method of manufacturing a semiconductor device according to a sixth embodiment of the present invention.

First, a wiring board 1 as shown in FIG. 7A is prepared. The wiring board 1 as shown in FIG. 7A is similar to that shown in FIG. 5F, and it is manufactured by the method for manufacturing a wiring board according to the above-mentioned fifth embodiment, through the processes similar to those as illustrated in FIGS. 5A-5F.

Figure 7B:
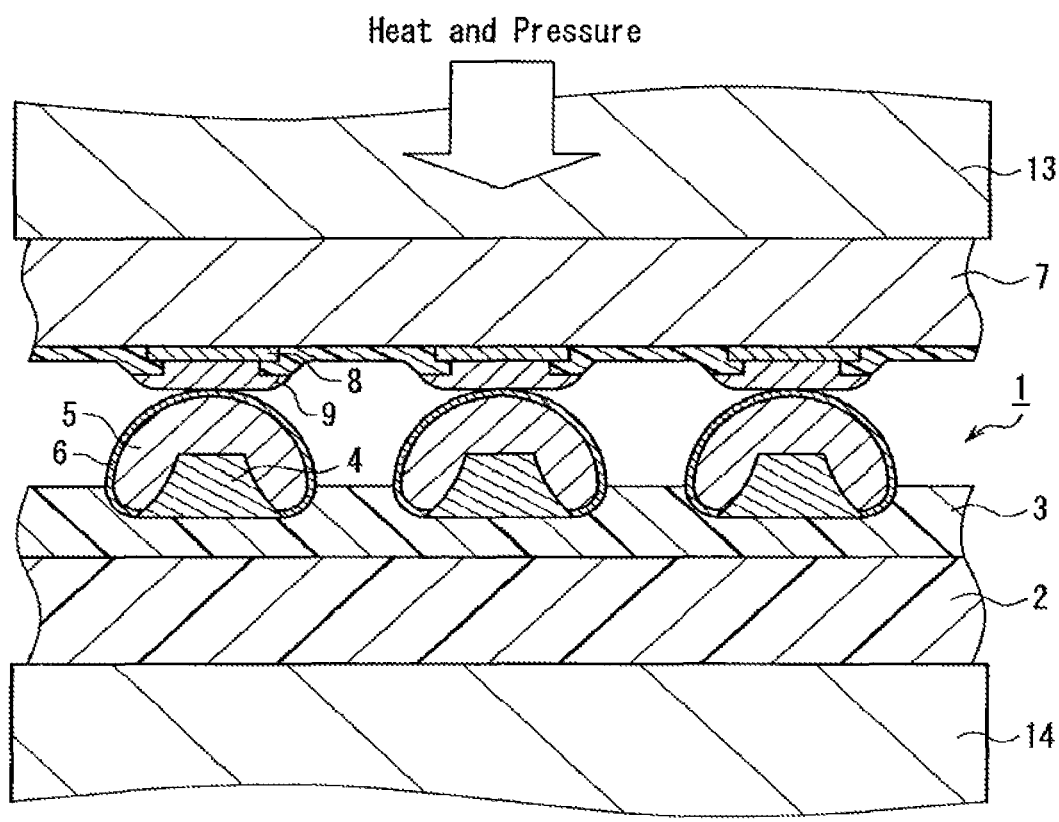
Figure 8:
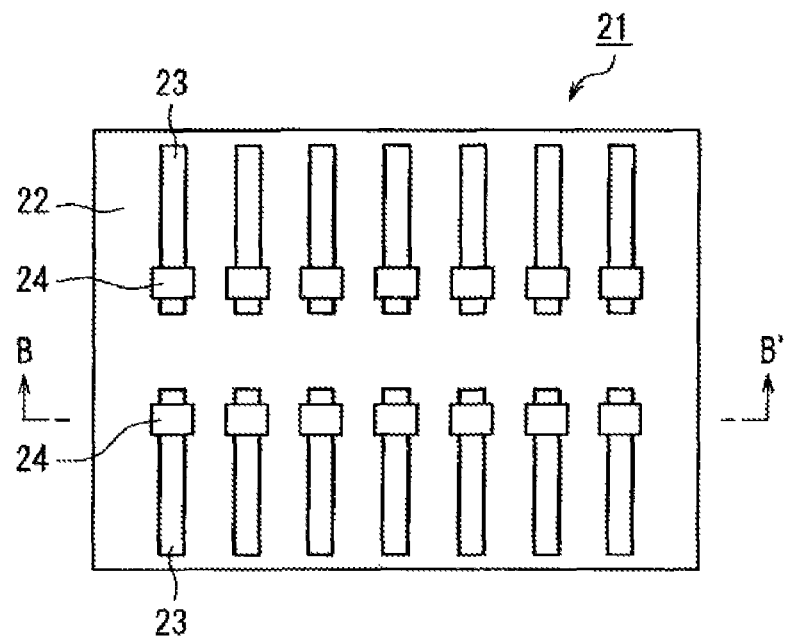
FIG. 8 is a plan view showing an example of a conventional wiring board.
Figure 9:
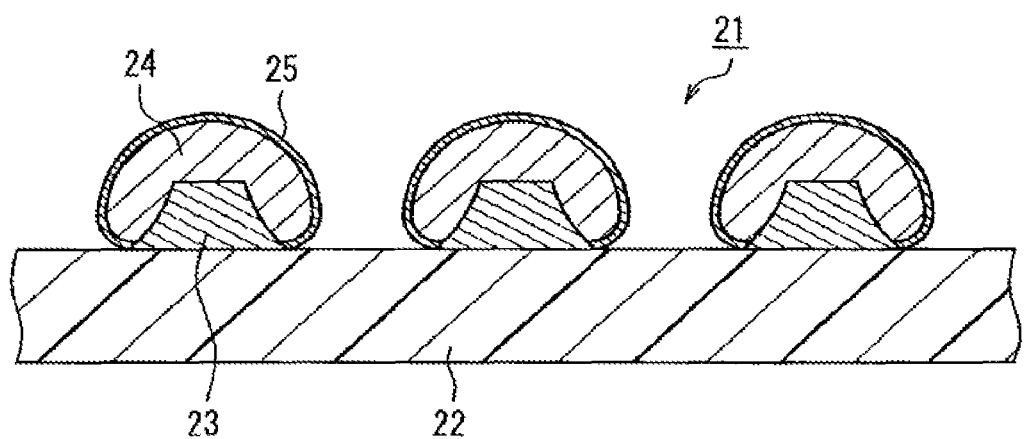
FIG. 9 is a sectional view showing the cross section of the wiring board taken along the line B-B' in FIG. 8.
Figure 10:
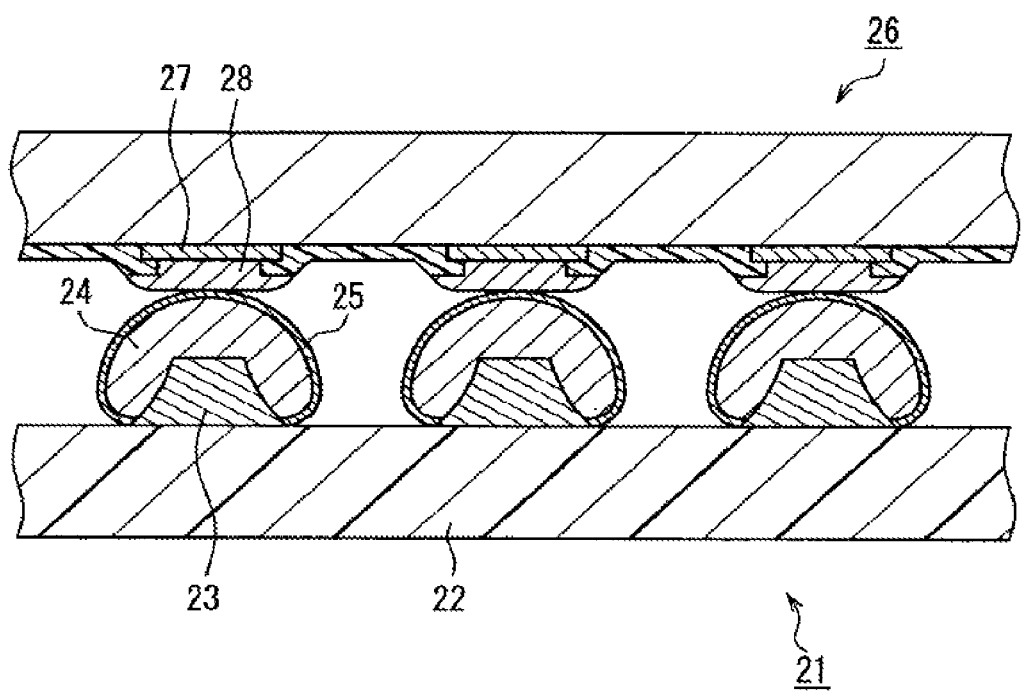
FIG. 10 is a sectional view showing a semiconductor device using an example of a conventional wiring board.

Next, as shown in FIG. 7B, the wiring board 1 is placed on the stage 14. A semiconductor element 7 provided with electrode pads 8 and second conductive layers 9 formed to coat the surfaces of the electrode pads 8 is placed on the wiring board 1. Next, the back face of the semiconductor element 7 is subjected to heat and pressure from above by the heating tool 13 so as to bond the second conductive layers 9 on the electrode pads 8 and the first conductive layers 6 on the bumps 5, and at the same time, causes the back faces of the conductor wirings 4 and the back faces and parts of the side faces of the bumps 5 to be buried inwards from the surface of the adhesive layer 3. Thereby, the adhesive layer 3 is melted to adhere to the bumps 5 via the first conductive layers 6.

If ultrasonic vibration is applied at the same time of application of heat and pressure through the back face of the semiconductor chip, the first conductive layers 6 and the second conductive layers 9 can be bonded to each other in a short time.

According to the sixth embodiment, since the semiconductor element 7 is face-down mounted and at the same time, the back faces and parts of the side faces of the bumps 5 are caused to be buried inwards from the surface of the adhesive layer so as to be adhered to the adhesive layer 3, the time for manufacturing the semiconductor device can be shortened.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A wiring board comprising:
    an insulating base;
    an adhesive layer formed on the surface of the insulating base;
    a conductor wiring formed on an upper surface of the adhesive layer; and
    a bump formed crossing the longitudinal direction of the conductor wiring over regions on the adhesive layer on both sides of the conductor wiring,
    wherein a back face of the conductor wiring at a region where the bump is formed, and a back face and a part of a side face of the bump formed on both sides of the conductor wiring, are embedded in the adhesive layer so as to be adhered to an inside surface of the adhesive layer, with an upper surface of the conductor wiring on which the bump is formed being higher than an outside surface of the adhesive layer which is exposed to outside.

2. The wiring board according to claim 1, wherein the bump is wider than the back face of the conductor wiring, and a surface of an area ranging from the back face of the conductor wiring to the side faces of the bump via the back faces of the bump has a smooth convex shape.

3. The wiring board according to claim 1, wherein the adhesive layer formed on the surface of the insulating base has a thickness greater than the distance between the back face of the conductor wiring at a region where the bump is formed and the insulating base, the back face and the part of the side face of the bump formed on both sides of the conductor wiring are embedded in the adhesive layer.

4. The wiring board according to claim 1, wherein the surface of the bump and the regions of the bump formed on the adhesive layer on both sides of the conductor wiring are coated with a first conductive layer formed of at least one material different from the material of the bump.

5. The wiring board according to claim 4, wherein the side faces of the bump on the regions embedded in the surface of the adhesive layer are adhered to the adhesive layer via the first conductive layer.

6. A wiring board comprising:
    an insulating base having at least an adhesive surface;
    a conductor wiring formed on an upper surface of the insulating base; and
    a bump formed crossing the longitudinal direction of the conductor wiring over regions on the insulating base on both sides of the conductor wiring,
    wherein a back face of the conductor wiring at a region where the bump is formed, and a back face and a part of a side face of the bump formed on both sides of the conductor wiring, are embedded in the insulating base so as to be adhered to an inside surface of the insulating base, with an upper surface of the conductor wiring on which the bump is formed being higher than an outside surface of the insulating base which is exposed to outside.

7. The wiring board according to claim 6, wherein the bump is wider than the back face of the conductor wiring, and a surface of an area ranging from the back face of the conductor wiring to the side faces of the bump via the back faces of the bump has a smooth convex shape.

8. The wiring board according to claim 6, wherein the surface of the bump and the regions of the bump on the insulating base on both sides of the conductor wiring are coated with a first conductive layer formed of at least one material different from the material of the bump.

9. The wiring board according to claim 8, wherein the side faces of the bump on the regions embedded in the surface of the insulating base are adhered to the insulating base via the first conductive layer.

10. A semiconductor device comprising the wiring board according to claim 1 and a semiconductor chip mounted on the wiring board, wherein an electrode pad on the semiconductor chip and the bump formed on the wiring board are connected electrically to each other.

11. The semiconductor device according to claim 10, further comprising a second conductive layer formed on the surface of the electrode pad, and the second conductive layer is formed of at least one material different from the material of the electrode pad.

12. A semiconductor device comprising the wiring board according to claim 6 and a semiconductor chip mounted on the wiring board, wherein an electrode pad on the semiconductor chip and the bump formed on the wiring board are connected electrically to each other.

13. The semiconductor device according to claim 12, further comprising a second conductive layer formed on the surface of the electrode pad, and the second conductive layer is formed of at least one material different from the material of the electrode pad.

\* \* \* \* \*